(12) United States Patent
Huang et al.

(10) Patent No.: US 10,784,117 B2
(45) Date of Patent: Sep. 22, 2020

(54) DEFECT RELIEVING METHOD FOR FLOATING GATE, AND SEMICONDUCTOR STRUCTURE

(71) Applicant: Wuhan Xinxin Semiconductor Manufacturing Co., Ltd., Hubei (CN)

(72) Inventors: Shengnan Huang, Hubei (CN); Qingwei Luo, Hubei (CN); Yun Li, Hubei (CN)

(73) Assignee: Wuhan Xinxin Semiconductor Manufacturing Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/235,022

(22) Filed: Dec. 28, 2018

(65) Prior Publication Data

US 2019/0362982 A1 Nov. 28, 2019

(30) Foreign Application Priority Data

May 23, 2018 (CN) .......................... 2018 1 0503726

(51) Int. Cl.
*H01L 21/311* (2006.01)
*H01L 21/28* (2006.01)
(Continued)

(52) U.S. Cl.
CPC .. *H01L 21/31116* (2013.01); *H01L 21/02068* (2013.01); *H01L 21/31053* (2013.01);
(Continued)

(58) Field of Classification Search
None
See application file for complete search history.

(56) References Cited

U.S. PATENT DOCUMENTS

| 7,985,687 B1* | 7/2011 | Hui ..................... H01L 21/3081 |
| | | 438/704 |
| 2002/0093073 A1* | 7/2002 | Mori ..................... H01L 27/105 |
| | | 257/510 |

(Continued)

FOREIGN PATENT DOCUMENTS

| CN | 103943549 A | 7/2014 |
| CN | 104078351 A | 10/2014 |

(Continued)

*Primary Examiner* — Herve-Louis Y Assouman
(74) *Attorney, Agent, or Firm* — Muncy, Geissler, Olds & Lowe, P.C.

(57) ABSTRACT

A defect relieving method for a floating gate is disclosed, which includes: providing a front-end structure, including an active region, a gate oxide layer on the active region, a mask layer on the gate oxide layer, a plurality of trenches penetrating through the mask layer, the gate oxide layer, and at least part of the active region, and a filler that is filled in the trenches; performing a first etching process to remove a first thickness of the mask layer between adjacent ones of the trenches; performing a second etching process to remove a remaining thickness of the mask layer between the adjacent trenches, and reducing a width of a portion of the filler that exceeds a top surface of the gate oxide layer, thereby an opening is formed; and filling the opening with a floating gate. The method increases the diameter of the opening, thus avoiding occurrence of voids.

8 Claims, 3 Drawing Sheets

(51) Int. Cl.
*H01L 21/02* (2006.01)
*H01L 21/3105* (2006.01)
*H01L 21/762* (2006.01)
*H01L 29/423* (2006.01)
*H01L 27/11521* (2017.01)

(52) U.S. Cl.
CPC .. *H01L 21/76224* (2013.01); *H01L 27/11521* (2013.01); *H01L 29/40114* (2019.08)

(56) References Cited

U.S. PATENT DOCUMENTS

| | | | |
|---|---|---|---|
| 2006/0286713 A1* | 12/2006 | Lee | H01L 21/76224 438/106 |
| 2010/0032813 A1* | 2/2010 | Riley | H01L 21/31654 257/632 |
| 2014/0353737 A1* | 12/2014 | Iwamoto | H01L 27/11524 257/315 |
| 2015/0145017 A1* | 5/2015 | Wang | H01L 29/66825 257/316 |

FOREIGN PATENT DOCUMENTS

| | | |
|---|---|---|
| CN | 104103593 A | 10/2014 |
| CN | 104112654 A | 10/2014 |
| CN | 103187258 A | 7/2015 |
| CN | 104979172 A | 10/2015 |
| CN | 106469730 A | 3/2017 |

* cited by examiner

DEFECT RELIEVING METHOD FOR FLOATING GATE, AND SEMICONDUCTOR STRUCTURE

CROSS-REFERENCE TO RELATED APPLICATION

This application claims the priority of Chinese patent application number 201810503726.5, filed on May 23, 2018, the entire contents of which are incorporated herein by reference.

TECHNICAL FIELD

The present invention relates to the field of semiconductors, and in particular, to a defect relieving method for a floating gate, and a semiconductor structure.

BACKGROUND

In recent years, flash memories rapidly develop among storage devices using semiconductor integrated circuits. Because of high integration, quick access, and easily erasable and rewriteable features, the flash memories are widely applied in multiple fields such as microcomputers and automation control. A typical flash memory has a polysilicon-doped floating gate and a control gate. The floating gate is used to store data, and the control gate is connected to word lines and used to control the floating gate.

In the process for fabricating a floating gate, a mask layer needs to be removed to form a gap, to realize filling with the floating gate. In the prior art, phosphoric acid is generally used to remove silicon nitride by one step, to form a gap shaped like an inverted trapezoid and having a small opening. A high depth-to-width ratio and a small filling opening easily lead to occurrence of voids in the floating gate after filling, reducing the product yield.

Therefore, it is in urgent need to provide a defect relieving method for a floating gate, so as to avoid occurrence of voids formed during filling with the floating gate after the mask layer is removed in the process for fabricating the floating gate in the prior art, thus ensuring product yield.

SUMMARY OF THE INVENTION

An objective of the present invention is to provide a defect relieving method for a floating gate, so as to avoid occurrence of voids formed during filling with the floating gate after the mask layer is removed in the floating gate forming process in the prior art, thus ensuring product yield.

To solve the problem in the prior art, the present invention provides a defect relieving method for a floating gate, which includes the following steps:

providing a front-end structure, including an active region, a gate oxide layer on the active region, a mask layer on the gate oxide layer, a plurality of trenches penetrating through the mask layer, the gate oxide layer, and at least part of the active region, and a filler that is filled in the plurality of trenches;

performing a first etching process to remove a first thickness of the mask layer between adjacent ones of the plurality of trenches;

performing a second etching process to remove a remaining thickness of the mask layer between the adjacent ones of the plurality of trenches, and reducing a width of a portion of the filler that exceeds a top surface of the gate oxide layer, thereby an opening is formed; and filling the opening with a floating gate.

Alternatively, in the defect relieving method for a floating gate, phosphoric acid is used in the first etching process and has a concentration of 80% to 90%.

Alternatively, in the defect relieving method for a floating gate, the first etching process is performed for 7 to 9 minutes.

Alternatively, in the defect relieving method for a floating gate, hydrofluoric acid and phosphoric acid are used in the second etching process, the hydrofluoric acid has a concentration of 46% to 52%, the phosphoric acid has a concentration of 80% to 90%.

Alternatively, in the defect relieving method for a floating gate, duration of applying etching using the hydrofluoric acid is 55 to 65 seconds in the second etching process, so as to remove the portion of the filler that disposes above the top surface of the gate oxide layer; and wherein duration of etching using applying the phosphoric acid is not less than 53 minutes, so as to completely remove the mask layer in the opening.

Alternatively, in the defect relieving method for a floating gate, the opening has a uniform width from top to bottom.

Alternatively, in the defect relieving method for a floating gate, the step of providing a front-end structure includes:

providing a substrate;

forming an active region material layer by ion implantation;

successively depositing the gate oxide layer and the mask layer;

forming the plurality of trenches penetrating through the mask layer, the gate oxide layer and at least part of the substrate by photolithography and etching, wherein each of the plurality of trenches tapers downwards and the active region is defined by adjacent ones of the plurality of trenches;

filling the plurality of trenches with the filler; and performing surface planarization by polishing.

Alternatively, in the defect relieving method for a floating gate, the etching includes dry etching.

Alternatively, in the defect relieving method for a floating gate, the method further includes performing wet cleaning after the step of filling the opening with a floating gate.

The present invention also provides a semiconductor structure, which includes: an active region;

a gate oxide layer on the active region;

floating gates on the gate oxide layer; and an isolation structure between adjacent floating gates, the isolation structure penetrating through the gate oxide layer and at least part of the active region, wherein a part of the isolation structure that exceeds a top surface of the gate oxide layer has a uniform width from top to bottom.

The defect relieving method for a floating gate provided by the present invention includes the following steps: providing a front-end structure; performing first etching to remove a mask layer of a first thickness between adjacent trenches; then performing second etching to remove the remaining mask layer between the adjacent trenches, and reducing the width of a part, of the filler, that exceeds the top surface of the gate oxide layer, to form an opening; and finally, filling the opening with a floating gate. In the present invention, phosphoric acid is applied to the mask layer, to remove the mask layer on a shallow layer of the active region of the floating gate, and thus a concave shallow trench is formed, which offers space to subsequently applied phosphoric acid and hydrofluoric acid. In this way, the place where the hydrofluoric acid is subsequently applied can be under control. Then, the phosphoric acid and the hydrofluoric acid are applied. The hydrofluoric acid aims to remove the filler around the opening, so as to increase the diameter of the opening, thus avoiding occurrence of voids caused by a too-small opening during filling with the floating gate. The phosphoric acid aims to completely remove the mask layer, to form gaps to be filled with the floating gate.

The present invention completely removes the mask layer, to form gaps to be filled with the floating gate; and further makes the filling gaps not taper upwards, to avoid occurrence of voids caused by a too-small opening, such that the floating gate has a desired shape and structure.

In the figures: 1-Substrate, 2-Gate oxide layer, 3-Mask layer, 4-Filler, 5-Opening, 6-Floating gate.

DETAILED DESCRIPTION OF EXEMPLARY EMBODIMENTS

Specific embodiments of the present invention will be described in detail below with reference to the accompanying drawings. Advantages and features of the present invention will be more apparent from the description and appended claims. It should be noted that the accompanying drawings are in a very simplified form and all use non-precise proportions, and are only used to conveniently and clearly describe the embodiments of the present invention.

In the following description, it should be understood that, when a layer (or film), region, pattern, or structure is referred to as being "on" a substrate, layer (or film), region, and/or pattern, it may be located directly on another layer or substrate, and/or there may also be an intervening layer. In addition, it should be understood that, when a layer is referred to as being "below" another layer, it may be located directly below another layer, and/or there may also be one or more intervening layers. Reference to "on" and "below" in each layer may be made based on the accompanying drawings.

Figure 1:
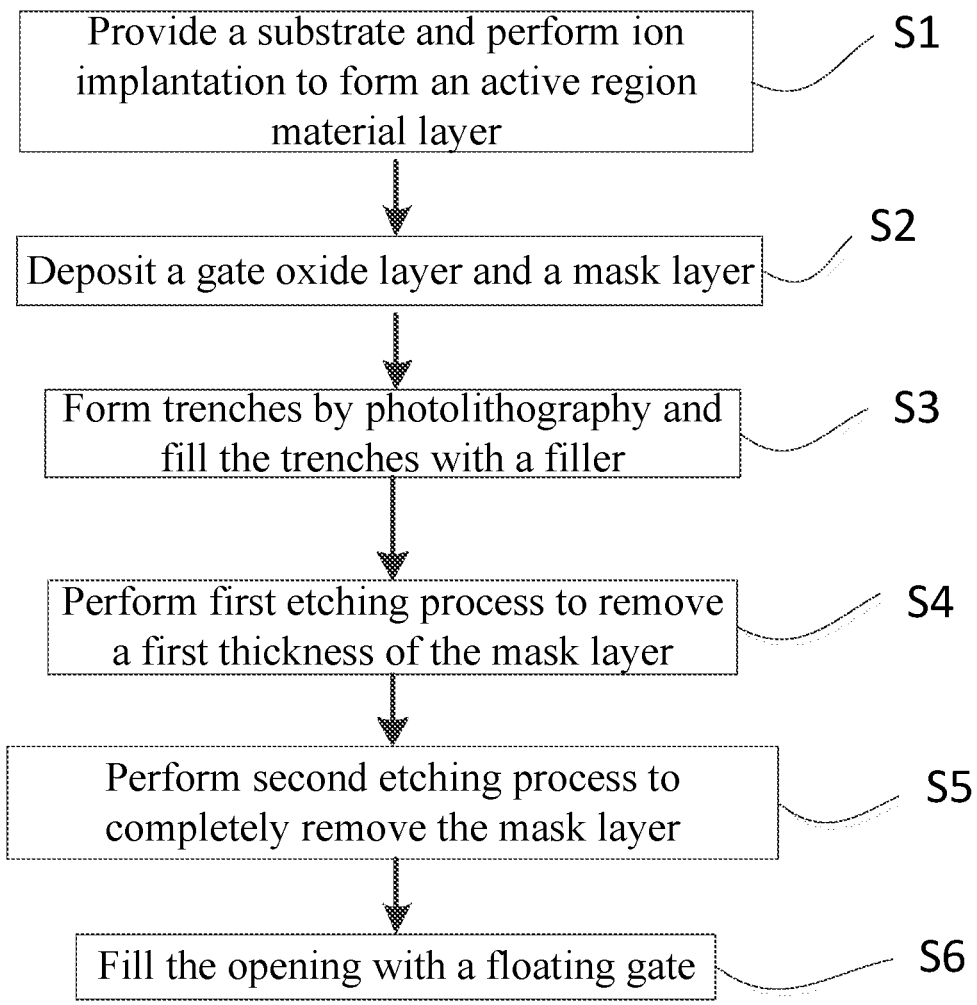
FIG. 1 is a flowchart of a defect relieving method for a floating gate according to an embodiment of the present invention.
Figure 2:
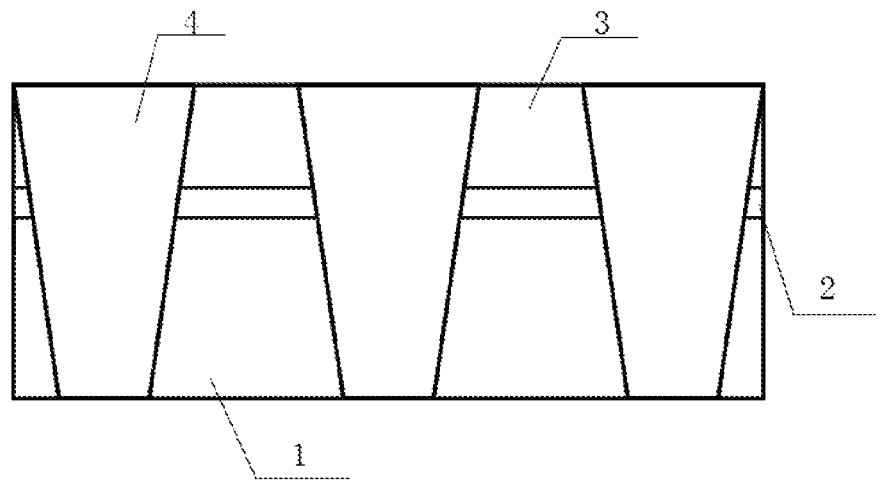
FIG. 2 is a schematic diagram showing that an active region of the floating gate is filled with a filler according to the embodiment of the present invention.
Figure 3:
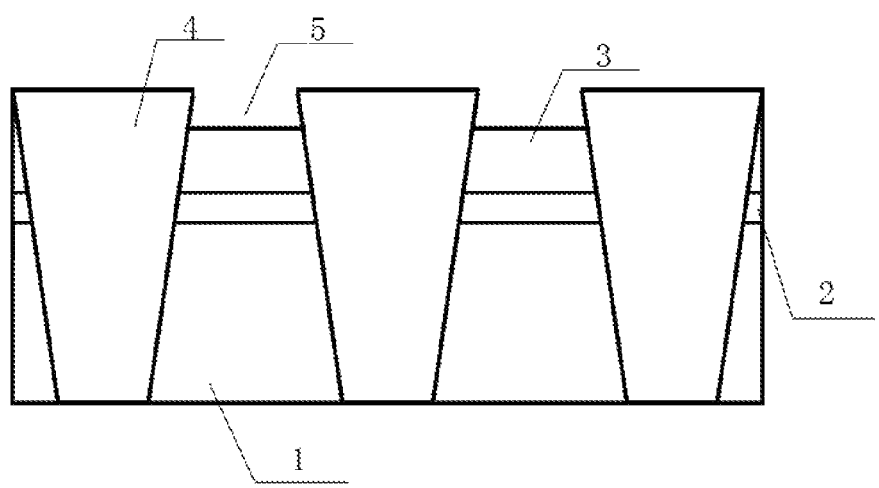
FIG. 3 is a schematic structural diagram after first etching according to the embodiment of the present invention.
Figure 4:
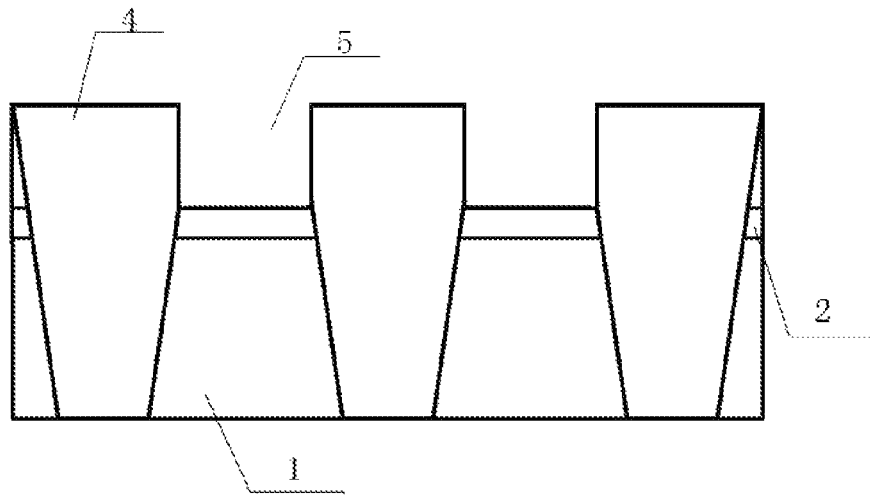
FIG. 4 is a schematic structural diagram after second etching according to the embodiment of the present invention.
Figure 5:
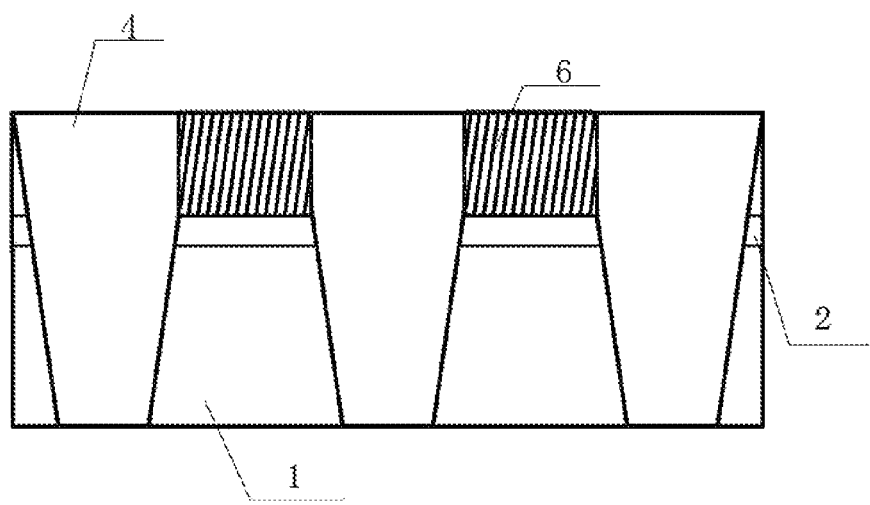
FIG. 5 is a schematic structural diagram of a polysilicon-doped floating gate according to the embodiment of the present invention.

Referring to FIG. 1 to FIG. 5, FIG. 1 is a flowchart of a defect relieving method for a floating gate according to an embodiment of the present invention; FIG. 2 is a schematic diagram showing that an active region of the floating gate is filled with a filler according to the embodiment of the present invention; FIG. 3 is a schematic structural diagram after first etching according to the embodiment of the present invention; FIG. 4 is a schematic structural diagram after second etching according to the embodiment of the present invention; and FIG. 5 is a schematic structural diagram of a polysilicon-doped floating gate according to the embodiment of the present invention.

As shown in FIG. 1 to FIG. 5, the present invention provides a defect relieving method for a floating gate, which includes the following step:

providing a front-end structure, which includes an active region, a gate oxide layer 2 on the active region, a mask layer 3 on the gate oxide layer 2, a plurality of trenches penetrating through the mask layer 3, the gate oxide layer 2 and at least part of the active region, and a filler 4 used to fill the trenches;

performing a first etching to remove a first thickness of the mask layer 3 between adjacent trenches;

performing a second etching to remove the remaining mask layer 3 between the adjacent trenches, and reducing the width of a part, of the filler 4, that exceeds a top surface of the gate oxide layer 2, to form an opening 5; and filling the opening 5 with a floating gate 6.

The present invention completely removes the mask layer 3, to form gaps to be filled with the floating gate 6, and further controls the filling gaps not to taper upwards, to avoid occurrence of voids caused by a too-small opening, such that the floating gate 6 has a desired shape and structure.

Referring to FIG. 2, step S1 in FIG. 1 is performed. A substrate 1 is provided, and ion implantation is carried out to form an active region material layer. Generally, an active region is a region on which an active device is fabricated on the substrate 1.

Step S2 is performed. A gate oxide layer 2 and a mask layer 3 are deposited, where the gate oxide layer 2 is deposited on the active region material layer and the mask layer 3 is deposited on the gate oxide layer 2. The gate oxide layer 2 may be used as a buffer layer for preventing the mask layer 3 of high rigidity from directly contacting the substrate 1 and damaging the substrate 1. The mask layer 3 may be used as a hard mask to etch and duplicate corresponding patterns. Preferably, the gate oxide layer 2 and the mask layer 3 are silicon-containing compounds. For example, the gate oxide layer 2 is silicon dioxide and the mask layer 3 is silicon nitride.

Afterwards, step S3 is performed. Photolithography is performed to form trenches. Specifically, in the present invention, it is required to etch trenches for power lines in the active region, such that the active region can normally operate under an externally applied appropriate bias voltage. Etching is corrosion by photolithography in narrow understanding. First, a photoresist is exposed to light by photolithography, and then corrosion is realized in another manner to get rid of the part that needs to be removed. In the present invention, etching is performed on the substrate 1, the gate oxide layer 2 and the mask layer 3 as required, to form the trenches in the active region.

Further, each trench formed after etching tapers downwards, and thus the mask layer 3 is shaped like an inverted trapezoid tapering upwards. As shown in FIG. 2, a filler 4 is used to fill the trenches in the active region, so as to protect the floating gate 6 from damage in a subsequent process. Preferably, the filler 4 in the trenches is planarized by polishing. The filler 4 may be a substance that can be easily removed and resist addition of impurities. The filler 4 is preferably silicon dioxide which can avoid introduction of other impurities into the floating gate 6 during the process, thus ensuring the product quality.

Further, after the trenches in the active region are filled with the filler 4, the method further includes the following step: polishing the filler 4 till the height of the remaining filler is flush with the mask layer 3. Specifically, a polisher is used to polish the filler 4 and receive a signal regarding a polished object. When reaching the mask layer 3, the polisher receives a signal indicating that the mask layer 3 is reached and determines that the polished object also includes other substances in addition to the filler 4. Then, the polisher is controlled to stop polishing. Therefore, the mask layer 3 is also able to provide a signal for the polisher.

Generally, the etching process provided by the embodiment of the present invention includes dry etching which is a technique using a plasma for thin film etching.

Referring to FIG. 3, step S4 in FIG. 1 is performed. First etching is performed to remove the mask layer 3 of a first thickness between adjacent trenches. Specifically, phosphoric acid is used in the first etching, where the phosphoric acid has a concentration of 80% to 90%, such as 83%, 85% or 87%. The etching using phosphoric acid may be carried out at the temperature of 155° C. to 165° C., and is carried out preferably at 160° C. Duration of applying the phosphoric acid is 7 to 9 minutes, such as 7 minutes 30 seconds, 8 minutes, or 8 minutes 30 seconds. In the first etching, the phosphoric acid is applied to the mask layer 3, to remove the upper portion of the mask layer 3 in the active region, and thus a concave shallow trench is formed, which offers space to subsequently applied phosphoric acid and hydrofluoric acid. In this way, the subsequently applied hydrofluoric acid solution can be under control and is prevented from flowing to other parts, to avoid removing substances that should not be removed.

Referring to FIG. 4, step S5 in FIG. 1 is performed. Second etching is performed to remove the lower portion of the mask layer 3, thereby the opening 5 is formed. Specifically, hydrofluoric acid and phosphoric acid are used in the second etching. The hydrofluoric acid has a concentration of 46% to 52%, such as 48%, 49% or 50%; and may react at the room temperature. The phosphoric acid has a concentration same as that in the first etching, which is 80% to 90%. The phosphoric acid reacts preferably at the temperature of 155° C. to 165° C.

Further, in this step of applying the phosphoric acid and the hydrofluoric acid, the phosphoric acid and the hydrofluoric acid may be applied to the same time or at different times. Specifically, duration of applying the hydrofluoric acid is 55 to 65 seconds, such as 58, 60, or 62 seconds, till the filler 4 around the opening 5 is removed. Thus, the diameter of the opening 5 is increased, to avoid occurrence of voids caused by a too-small diameter of the opening 5 during filling with the floating gate 6. Further, duration of applying the phosphoric acid is not less than 53 minutes. The excess phosphoric acid is applied to remove the lower portion of the mask layer 3, till the mask layer 3 is completely removed, thus forming gaps to be filled with the floating gate 6.

Preferably, by the etching process provided by the present invention, the opening 5 has the same width from top to bottom. Generally, the opening 5 may have inconsistent widths from top to bottom, provided that no void occurs after the opening 5 is filled with the floating gate 6.

The present invention completely removes the mask layer 3, to form gaps to be filled with the floating gate 6; and further makes the filling gaps not taper upwards, to avoid occurrence of voids caused by a too-small opening, such that the floating gate 6 has a desired shape and structure.

Referring to FIG. 5, step S6 in FIG. 1 is performed. The floating gate 6 is used to fill the opening 5. Specifically, the floating gate 6 is used to fill the opening 5 formed after the mask layer 3 is completely removed, and no void is left behind.

In the defect relieving method for the floating gate 6 provided by the embodiment of the present invention, after the opening 5 is filled with the floating gate 6, the method further includes the following step: cleaning the floating gate 6 by means of wet cleaning. The floating gate 6 is cleaned so as to remove the filler 4 from the trenches and other residues from the surface of the floating gate 6.

Further, the means of cleaning the floating gate 6 includes: hydrofluoric acid, SC-1 and SC-2. SC-1 is a mixture of ammonia and hydrogen peroxide, and SC-2 is a mixture of hydrochloric acid and hydrogen peroxide. The hydrofluoric acid is mainly used to clean the filler 4 off the trenches. A mixture of SC-1 and SC-2, and the sulfuric acid solution are successively used to clean other residues off the surface of the floating gate 6.

Based on the foregoing procedure, the present invention also provides a semiconductor structure, which includes: an active region, a gate oxide layer 2 on the active region, a floating gate 6 on the gate oxide layer 2, and an isolation structure that is between adjacent floating gates 6 and penetrates through the gate oxide layer 2 and at least part of the active region, where a part, of the isolation structure, that exceeds the top surface of the gate oxide layer 2 has the same width from top to bottom.

In the semiconductor structure provided by the embodiment of the present invention, the floating gate 6 is on the gate oxide layer 2, with a standard structure and no voids inside, thus achieving a desired shape and structure of the floating gate 6.

To sum up, a defect relieving method for a floating gate provided by the present invention includes the following steps: providing a front-end structure; performing first etching to remove a mask layer of a first thickness between adjacent trenches; then performing second etching to remove the remaining mask layer between the adjacent trenches, and reducing the width of a plane in which the surface of a filler is located, to form an opening; and finally, filling the opening with a floating gate. Phosphoric acid is applied to the mask layer, to remove the upper portion of the mask layer in the active region of the floating gate, and thus a concave shallow trench is formed, which offers space to subsequently applied phosphoric acid and hydrofluoric acid. In this way, the place where the hydrofluoric acid is subsequently applied can be under control. Then, the phosphoric acid and the hydrofluoric acid are applied. The hydrofluoric acid aims to remove the filler around the opening, so as to increase the diameter of the opening, thus avoiding occurrence of voids caused by a too-small opening during filling with the floating gate. The phosphoric acid aims to completely remove the mask layer, to form gaps to be filled with the floating gate.

The present invention completely removes the mask layer, to form gaps to be filled with the floating gate; and further makes the filling gaps not taper upwards, to avoid occurrence of voids caused by a too-small opening, such that the floating gate has a desired shape and structure.

The above merely describes a preferred embodiment of the present invention, but does not impose any limitation on the present invention. Any equivalent changes or modifications made by persons skilled in the art to the technical solutions and technical contents disclosed in the present invention without departing from the technical scope of the present invention all belong to the technical content of the present invention and fall within the protection scope of the present invention.

What is claimed is:

1. A defect relieving method for a floating gate, comprising:
   providing a front-end structure, comprising an active region, a gate oxide layer on the active region, a mask layer on the gate oxide layer, a plurality of trenches penetrating through the mask layer, the gate oxide layer, and at least part of the active region, and a filler that is filled in the plurality of trenches;
   performing a first etching process to remove a first thickness of the mask layer between adjacent ones of the plurality of trenches;
   performing a second etching process to remove a remaining thickness of the mask layer between the adjacent ones of the plurality of trenches, and reducing a width of a portion of the filler that exceeds a top surface of the gate oxide layer, thereby an opening is formed; and
   filling the opening with a floating gate;
   wherein hydrofluoric acid and phosphoric acid are used in the second etching process, the hydrofluoric acid having a concentration of 46% to 52%, the phosphoric acid having a concentration of 80% to 90%.

2. The method of claim 1, wherein phosphoric acid is used in the first etching process and has a concentration of 80% to 90%.

3. The method of claim 2, wherein the first etching process is performed for 7 to 9 minutes.

4. The method of claim 1, wherein duration of applying etching using the hydrofluoric acid is 55 to 65 seconds in the second etching process, so as to remove the portion of the filler that disposes above the top surface of the gate oxide layer; and wherein duration of etching using applying the phosphoric acid is not less than 53 minutes, so as to completely remove the mask layer in the opening.

5. The method of claim 1, wherein the opening has a uniform width from top to bottom.

6. The method of claim 1, wherein the step of providing a front-end structure comprises:
   providing a substrate;
   forming an active region material layer by ion implantation;
   successively depositing the gate oxide layer and the mask layer;
   forming the plurality of trenches penetrating through the mask layer, the gate oxide layer and at least part of the substrate by photolithography and etching, wherein each of the plurality of trenches tapers downwards and the active region is defined by adjacent ones of the plurality of trenches;
   filling the plurality of trenches with the filler; and
   performing surface planarization by polishing.

7. The method of claim 6, wherein the etching comprises dry etching.

8. The method of claim 1, further comprising performing wet cleaning after filling the opening with the floating gate.

* * * * *